(12) United States Patent
Manipatruni et al.

(10) Patent No.: US 10,320,404 B2
(45) Date of Patent: Jun. 11, 2019

(54) COUPLED SPIN HALL NANO OSCILLATORS WITH TUNABLE STRENGTH

(71) Applicant: Intel Corporation, Santa Clara, CA (US)

(72) Inventors: Sasikanth Sasi Manipatruni, Portland, OR (US); George I. Bourianoff, Austin, TX (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 15/300,266

(22) PCT Filed: Jun. 18, 2014

(86) PCT No.: PCT/US2014/043036
§ 371 (c)(1),
(2) Date: Sep. 28, 2016

(87) PCT Pub. No.: WO2015/195122
PCT Pub. Date: Dec. 23, 2015

(65) Prior Publication Data
US 2017/0163275 A1 Jun. 8, 2017

(51) Int. Cl.
*H03L 7/26* (2006.01)
*B82Y 25/00* (2011.01)
(Continued)

(52) U.S. Cl.
CPC ............. *H03L 7/26* (2013.01); *G11C 11/161* (2013.01); *G11C 11/1675* (2013.01);
(Continued)

(58) Field of Classification Search
CPC ....... H03B 15/006; H03B 15/00; H01L 27/22; H01L 43/06; H01F 10/329; H01F 10/3254; H01F 10/3286; B82Y 25/00
See application file for complete search history.

(56) References Cited

U.S. PATENT DOCUMENTS 7,196,367 B2  3/2007  Nikonov et al.
7,616,412 B2 * 11/2009  Zhu .................... B82Y 10/00
                                                  360/324.2
(Continued)

FOREIGN PATENT DOCUMENTS

CN   101770804       7/2010
CN   101770804 A  *  7/2010 ............. G11C 11/18
(Continued)

OTHER PUBLICATIONS

Search Report and Opinion for European Patent Application No. 14895240.1, dated Jan. 22, 2018, 50 pages.
(Continued)

*Primary Examiner* — Ryan Johnson
(74) *Attorney, Agent, or Firm* — Schwabe, Williamson & Wyatt, P.C.

(57) ABSTRACT

Described is an oscillating apparatus which comprises: an interconnect with spin-coupling material (e.g., Spin Hall Effect (SHE) material); and a magnetic stack having two magnetic layers such that one of the magnetic layers is coupled to the interconnect, wherein each of the two magnetic layers have respective magnetization directions to cause the magnetic stack to oscillate.

13 Claims, 9 Drawing Sheets

(51) Int. Cl.
  *G11C 11/16* (2006.01)
  *G11C 11/18* (2006.01)
  *H01F 10/32* (2006.01)
  *H01L 43/06* (2006.01)
  *H01L 43/08* (2006.01)
  *H03B 15/00* (2006.01)

(52) U.S. Cl.
  CPC ............ *G11C 11/18* (2013.01); *H01F 10/329* (2013.01); *H01L 43/06* (2013.01); *H01L 43/08* (2013.01); *H03B 15/006* (2013.01); *B82Y 25/00* (2013.01)

(56) References Cited

U.S. PATENT DOCUMENTS

| | | | |
|---|---|---|---|
| 7,655,517 | B2 | 2/2010 | Nikonov et al. |
| 7,939,912 | B2 | 5/2011 | Nikonov et al. |
| 8,049,567 | B2 * | 11/2011 | Persson ............... H03B 15/006 257/421 |
| 8,063,460 | B2 | 11/2011 | Nikonov et al. |
| 8,198,692 | B2 | 6/2012 | Nikonov et al. |
| 8,427,246 | B2 * | 4/2013 | Lee ........................ H01L 43/08 257/422 |
| 8,450,818 | B2 | 5/2013 | Nikonov et al. |
| 8,455,966 | B2 | 6/2013 | Garner et al. |
| 8,604,886 | B2 | 12/2013 | Nikonov et al. |
| 8,697,454 | B2 | 4/2014 | Nikonov et al. |
| 8,796,794 | B2 | 8/2014 | Doyle et al. |
| 8,933,521 | B2 | 1/2015 | Nikonov et al. |
| 8,963,579 | B2 | 2/2015 | Nikonov et al. |
| 8,988,109 | B2 | 3/2015 | Manipatruni et al. |
| 9,028,323 | B2 | 5/2015 | Nikonov et al. |
| 9,070,468 | B2 | 6/2015 | Manipatruni et al. |
| 9,252,796 | B2 | 2/2016 | Nikonov et al. |
| 9,281,467 | B2 | 3/2016 | Nikonov et al. |
| 9,294,035 | B2 | 3/2016 | Manipatruni et al. |
| 9,460,768 | B2 | 10/2016 | Manipatruni et al. |
| 2010/0308923 | A1 | 12/2010 | Kaka |
| 2012/0126904 | A1 | 5/2012 | Lee et al. |
| 2012/0154063 | A1 | 6/2012 | Nikonov et al. |
| 2014/0056060 | A1 | 2/2014 | Khvalkovskiy et al. |
| 2014/0205851 | A1 | 7/2014 | Mahajan et al. |
| 2016/0248427 | A1 | 8/2016 | Nikonov et al. |

FOREIGN PATENT DOCUMENTS

| | | | |
|---|---|---|---|
| JP | 2009-080867 | 4/2009 | |
| JP | 2010-245419 | 10/2010 | |
| JP | 2011-124574 | 6/2011 | |
| JP | 2014-045196 | 3/2014 | |
| JP | 2014067837 A | 4/2014 | |
| KR | 201020140044941 B1 | 4/2014 | |
| WO | 2013025994 A2 | 2/2013 | |
| WO | WO 2014025838 | 2/2014 | |
| WO | WO 2014025838 A1 * | 2/2014 | ............. G11C 11/18 |
| WO | 2014204492 A1 | 12/2014 | |

OTHER PUBLICATIONS

Office Action for Japanese Patent Application No. 2016-566285, dated Feb. 23, 2018, 6 pages.
Office Action for Taiwan Patent Application No. 104115018, dated Dec. 13, 2016, 14 pages.
International Search Report and Written Opinion for International Patent Application No. PCT/US2014/043036, dated Feb. 27, 2015, 15 pages.
International Preliminary Report on Patentability, Patent Application No. PCT/US2014/043036, dated Dec. 29, 2016, 12 pages.
Notice of Allowance for Taiwan Patent Application No. 104115018, dated Oct. 20, 2017, 2 pages.
Georges B. et al. "Impact of the electrical connection of N Spin Transfer Oscillators on their synchronization : an analytical study," Arxiv.org, Cornell Cornell University Library, 201 Olin Library Cornell University Ithaca, NY 14853, Apr. 30, 2008.
B.Georges , Impact of the electrical connection of spin transfer nano-oscillators on their synchronization : an analytical study , Applied Physics Letters , Jun. 12, 2008, vol. 92 , pp. 232504-1-232504-3.
Sasikanth Manipatruni et al.: "Voltage and Energy-Delay Performance of Giant Spin Hall Effect Switching for Magnetic Memory and Logic", Jan. 22, 2013, Retrieved from the Internet: URL:https://arxiv.org/ftp/arxiv/papers/1301/1301.5374.pdf [retrieved on Jan. 10, 2018].
Office Action from Chinese Patent Application No. 201480079051.6, dated Aug. 30, 2018, 7 pgs.
Office Action from Japanese Patent Application No. 2016-566285, dated Mar. 12, 2019, 5 pgs.
Office Action from Chinese Patent Application No. 201480079051.6, dated Mar. 22, 2019, 8 pgs.

* cited by examiner

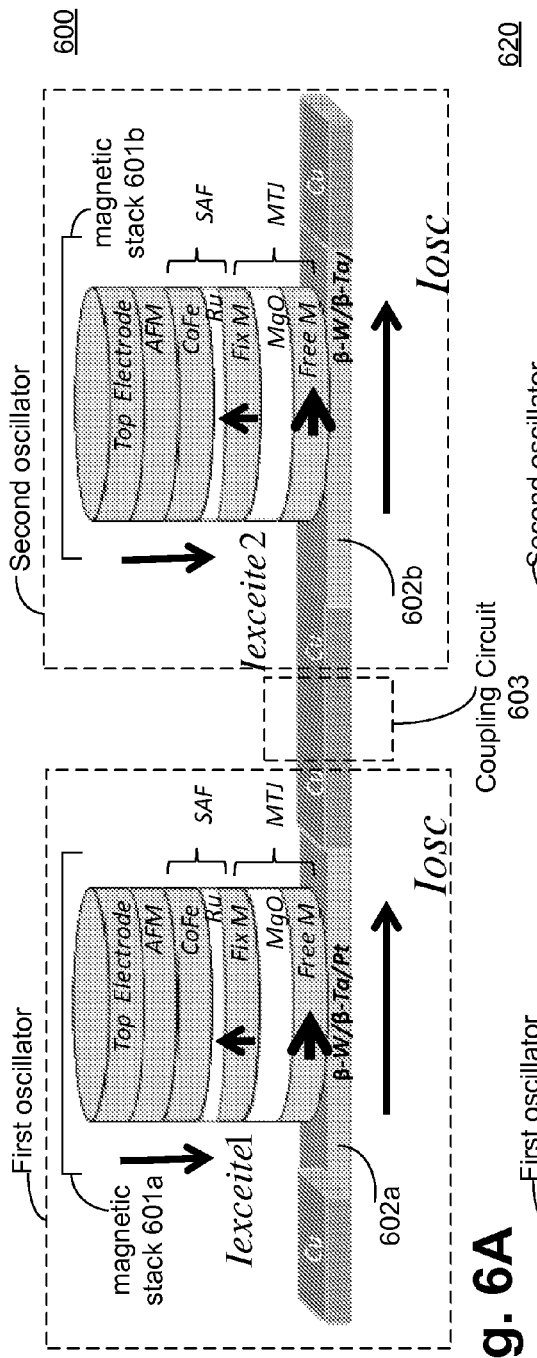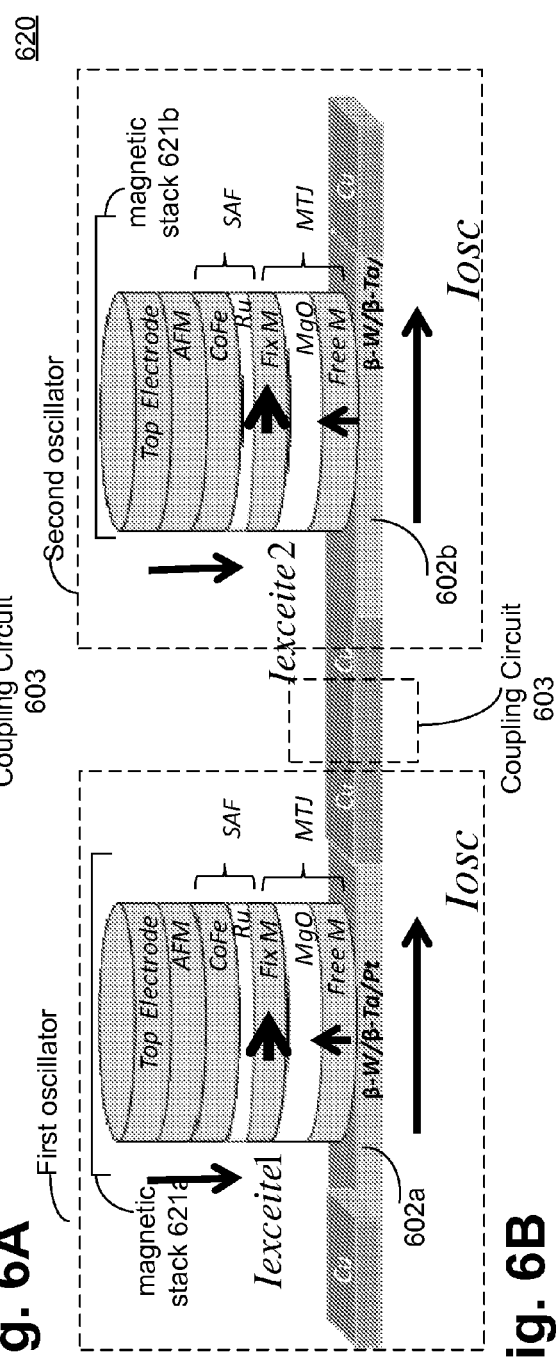
Fig. 6A
Fig. 6B

COUPLED SPIN HALL NANO OSCILLATORS WITH TUNABLE STRENGTH

CROSS-REFERENCE TO RELATED APPLICATIONS

This patent application is a U.S. National Phase Application under 35 U.S.C. § 371 of International Application No. PCT/US2014/043036, filed "Jun. 18, 2014", entitled "COUPLED SPIN HALL NANO OSCILLATORS WITH TUNABLE STRENGTH" which is incorporated by reference in its entirety.

BACKGROUND

On-chip embedded oscillators (or resonators) with high signal quality (signal to noise ratio) can enable energy efficient building blocks for computing and communications. However, existing solutions for on-chip embedded oscillators suffer from large footprint, and/or high operating power. These issues may limit or significantly constrain the design space for processors e.g., wireless SoCs (System on Chips).

Spin torque oscillators (STOs) provide a feasible solution to embedded nano-scale oscillators. One example of an STO is described with reference to FIG. 1. FIG. 1 illustrates STO 100 which consists of fixed and free ferromagnets (e.g., Co) sandwiched between non-magnetic layers (e.g., Cu) as shown. The fixed and free magnets together with the non-magnetic layers form a magnetic junction. If the non-magnetic layer between the ferromagnetic layers is a tunneling dielectric, the stack of layers is referred to as Magnetic Tunneling Junction (MTJ). When voltage $V_E$ is applied across the upper and lower non-magnetic layers of STO 100, current 'I' flows through STO 100. In this example, an external magnetic field bias 'B' is applied to cause STO 100 to oscillate. However, STO 100 is limited.

For example, STO 100 has a high operating power requirement due to large bias current (e.g., greater than 100 µA) and voltage $V_E$ (e.g., greater than 0.7 V) requirements of tunnel junction based MTJ. STO 100 also suffers from reliability issues due to high tunneling current in the MTJ. STO 100 uses external magnetic bias 'B' to operate as a self-sustained oscillator. This external magnetic bias 'B' is an additional cost and may introduce noise in signals on the processor. STO 100 also lacks an efficient coupling mechanism between individual oscillating elements.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 6A illustrates a SHO having a plurality of coupled SHOs with non-magnetic interconnect as the coupling circuit, according to one embodiment of the disclosure.

FIG. 6B illustrates a SHO having a plurality of coupled SHOs with non-magnetic interconnect as the coupling circuit, according to another embodiment of the disclosure.

DETAILED DESCRIPTION

Figure 1:
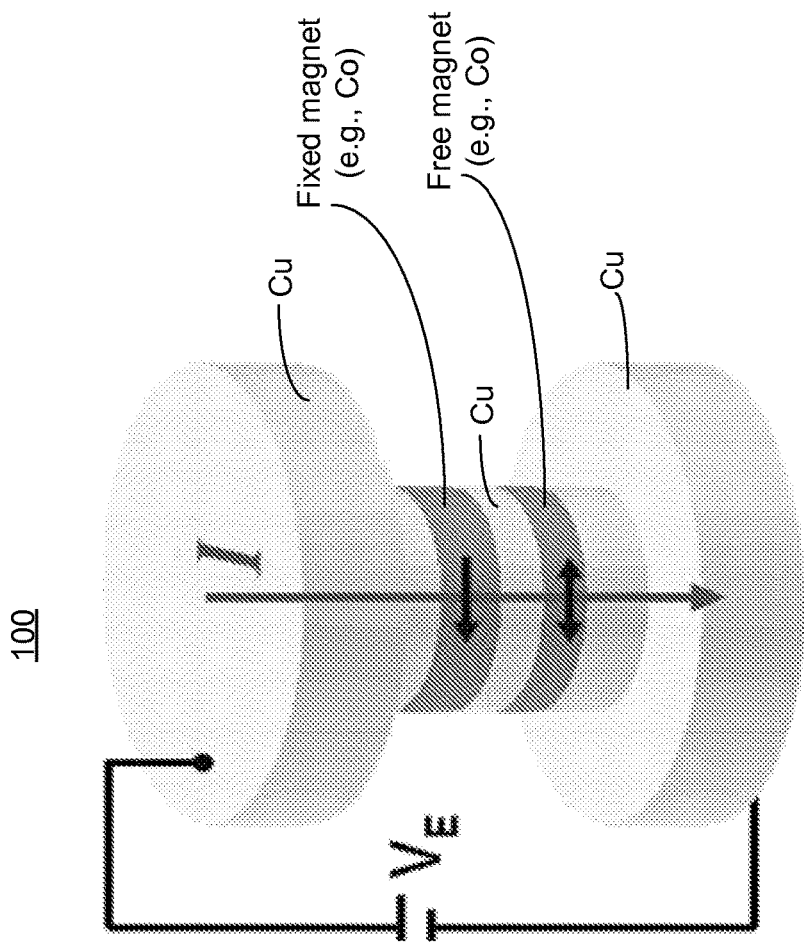
FIG. 1 illustrates a Spin Torque Oscillator (STO) that uses external magnetic bias to oscillate.

Some embodiments describe a resistive device (e.g., Magnetic Junction device) which is a three terminal self-sustained Spin Hall Oscillator (SHO) that operates via injection of spin current from a top electrode and a bottom electrode to produce magnetic oscillations in the free magnetic layer of the resistive device.

In one embodiment, the Spin Hall current ($I_{SH\text{-}control}$) from the Spin Hall Effect (SHE) material (also referred here as the SHE electrode or interconnect) interacts with the free magnetic layer to produce self sustained oscillation/excitation for oscillation. In one embodiment, a second tunneling excitation current ($I_{sense/control}$) interacts with a perpendicularly polarized free magnetic layer to produce/ensure self sustaining oscillations. In one embodiment, the path through the Magnetic Junction provides a sensing path generating an AC current at the oscillation frequency. In one embodiment, the path through the SHE interconnect of the SHO provides a path to couple other SHOs for coupling the state of the oscillators.

There are many technical effects of the embodiments. For example, the SHO operates independent of an external magnetic bias. This allows the SHO to be integrated into a chip without having external field application circuitry, according to one embodiment. In one embodiment, a coupling circuitry of the SHOs provides for charge based coupling which allows for tunable coupling that can be filtered, amplified, or switched OFF, for example. The SHO of some embodiments uses SHE which allows for net higher efficiency coupling than any known STO. Other technical effects will be evident from various embodiments described here.

The SHO of some embodiments can be used for a low power and small area digital clock source or an RF (radio frequency) source. Compared to an LC (inductor-capacitor) oscillator, in some embodiments, no inductor is needed by the SHO for generating an oscillating signal. Compared to traditional CMOS based oscillators, in some embodiments, no voltage or current biasing circuits (e.g., bandgap circuits) are used by the SHO for generating an oscillating signal. Compared to CMOS based oscillators, some embodiments of the SHO use fewer or no transistors. The embodiments of the SHO can be used to enable ultra-small RF (radio frequency) circuitry using spin devices. The embodiments of the SHO can be used to provide a natural clock source on-chip for handheld and low power devices (e.g., tablets, smart phones, etc.). The embodiments of the SHO can also enable formation of coupled oscillators for non-Boolean logic applications as well as signal processing applications.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nano tubes or spintronic devices. Source and drain terminals may be identical terminals and are interchangeably used here. A transistor can also be a Tunneling FET (TFET) device which has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2A:
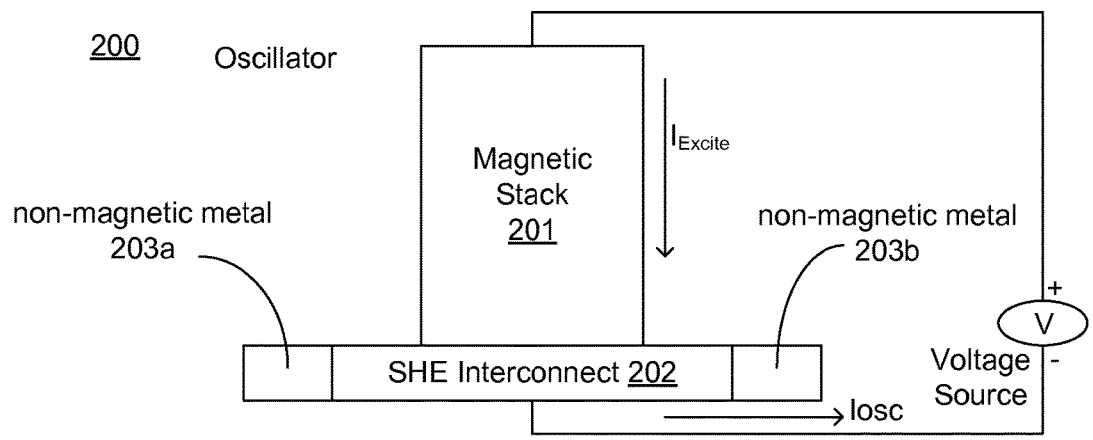
FIG. 2A illustrates a self sustained Spin Hall oscillator (SHO) with a magnetic stack, according to one embodiment of the disclosure.

FIG. 2A illustrates a self sustained SHO 200 with a magnetic stack, according to one embodiment of the disclosure. In one embodiment, SHO 200 comprises a Magnetic Stack 201 coupled to Interconnect 202 formed with spin-coupling material (e.g., SHE material). In one embodiment, one or both ends along the horizontal direction of SHE Interconnect 202 is formed of non-magnetic metals 203a/b. In one embodiment, Magnetic Stack 201 comprises an MTJ which is formed by stacking a ferromagnetic layer with a tunneling dielectric and another ferromagnetic layer. In one embodiment, Magnetic Stack 201 comprises a spin valve which is formed by stacking a ferromagnetic layer with a non-magnetic metal and another ferromagnetic layer. In other embodiments, other magnetic stacks may be used that can be coupled to Interconnect 202 formed from SHE material or other spin-coupling materials. The embodiments here are described with reference to Interconnect 202 being an SHE material Interconnect. However, the embodiments can also use Interconnect formed with other spin-coupling material.

In one embodiment, SHE Interconnect 202 is a metal interconnect that exhibits SHE properties. In one embodiment, SHE Interconnect 202 is exclusive to Magnetic Stack 201 i.e., it is not shared with other magnetic stacks. A SHE Interconnect can be connected to other SHE Interconnects with conventional conductors, such as copper Cu. In one embodiment, SHE Interconnect 202 is made β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. In one embodiment, the non-magnetic metals 203a/b are formed from one or more of: Cu, Co, α-Ta, Al, CuSi, or NiSi.

In one embodiment, when a voltage is applied across SHO 200 (for example by a Voltage Source), current $I_{Excite}$ flows through Magnetic Stack 201 causing an oscillation current $I_{OSC}$ to flow through SHE Interconnect 202. An example of the oscillation is described with reference to FIGS. 3A-C.

Figure 2B:
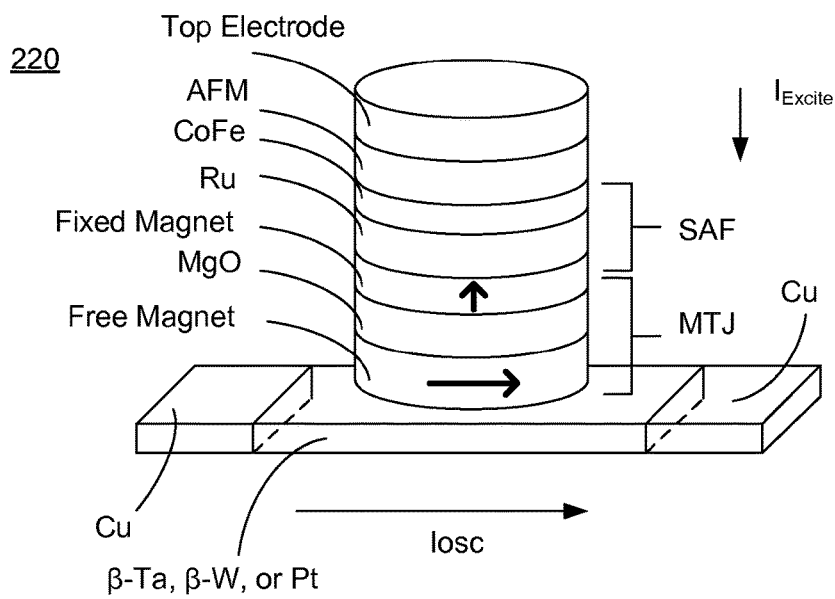
FIG. 2B illustrates a SHO with a Magnetic Tunnel Junction (MTJ) device, according to one embodiment of the disclosure.

FIG. 2B illustrates a SHO 220 with an MTJ, according to one embodiment of the disclosure. It is pointed out that those elements of FIG. 2B having the same reference numbers (or names) as the elements of any other figure can operate or function in any manner similar to that described, but are not limited to such.

In this embodiment, Magnetic Stack 201 comprises an MTJ. A wide combination of materials can be used for material stacking of the MTJ device. In this embodiment, the stack of materials include: $Co_xFe_yB_z$, MgO, $Co_xFe_yB_z$, Ru, $Co_xFe_yB_z$, IrMn, Ru, Ta, and Ru, where 'x,' 'y,' and 'z' are integers. In other embodiments, other materials may be used to form the MTJ device which includes a fixed magnetic layer and a free magnetic layer sandwiched between a non-magnetic dielectric (e.g., MgO).

In one embodiment, the MTJ stack comprises free magnetic layer, MgO tunneling oxide, a fixed magnetic layer which is a combination of CoFe/Ru/CoFe layers referred to as Synthetic Anti-Ferro-magnet (SAF)-based, and Anti-Ferromagnet (AFM). The SAF layer has the property, that the magnetizations in the two CoFe layers are opposite, and allows for cancelling the dipole fields around the free magnetic layer such that a stray dipole field will not control the free magnetic layer. A wide combination of materials can be used for material stacking.

In one embodiment, the magnetization direction of the fixed magnetic layer is perpendicular relative to the magnetization direction of the free magnetic layer (i.e., magnetization directions of the free and fixed magnetic layers are not parallel, rather they are orthogonal). For example, magnetization direction of the free magnetic layer is in-plane while the magnetization direction of the fixed magnetic layer is perpendicular to the in-plane. In one embodiment, magnetization direction of the fixed magnetic layer is in-plane while the magnetization direction of the free magnetic layer is perpendicular to the in-plane.

Figure 2C:
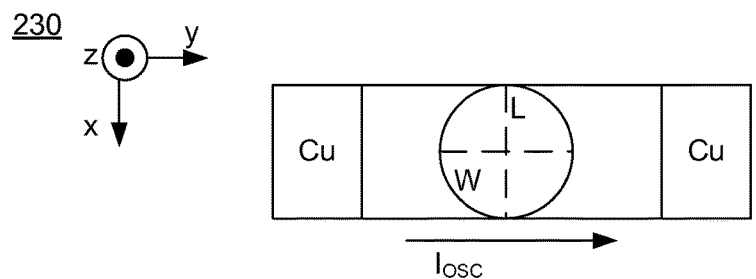
FIG. 2C illustrates a top view of the embodiment of FIG. 2B.

In one embodiment, thickness of the fixed magnetic layer determines its magnetization direction. For example, when the thickness of the fixed magnetic layer is above a certain threshold (depending on the material of the magnet, e.g. approximately 1.5 nm for CoFe), then the fixed magnetic layer exhibits magnetization direction which is in-plane. Likewise, when the thickness of the fixed magnetic layer is below a certain threshold (depending on the material of the magnet), then the fixed magnetic layer exhibits magnetization direction which is perpendicular to the plane of the magnetic layer. In one embodiment, thickness of the free magnetic layer also determines its magnetization direction in the same manner as in the fixed layer. Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC, BCC, or L10-type of crystals, where L10 is a type of crystal class which exhibits perpendicular magnetizations), can also determine the direction of magnetization. FIG. 2C illustrates a top view 230 of the embodiment of FIG. 2B.

Figures 3A, 3B, 3C:
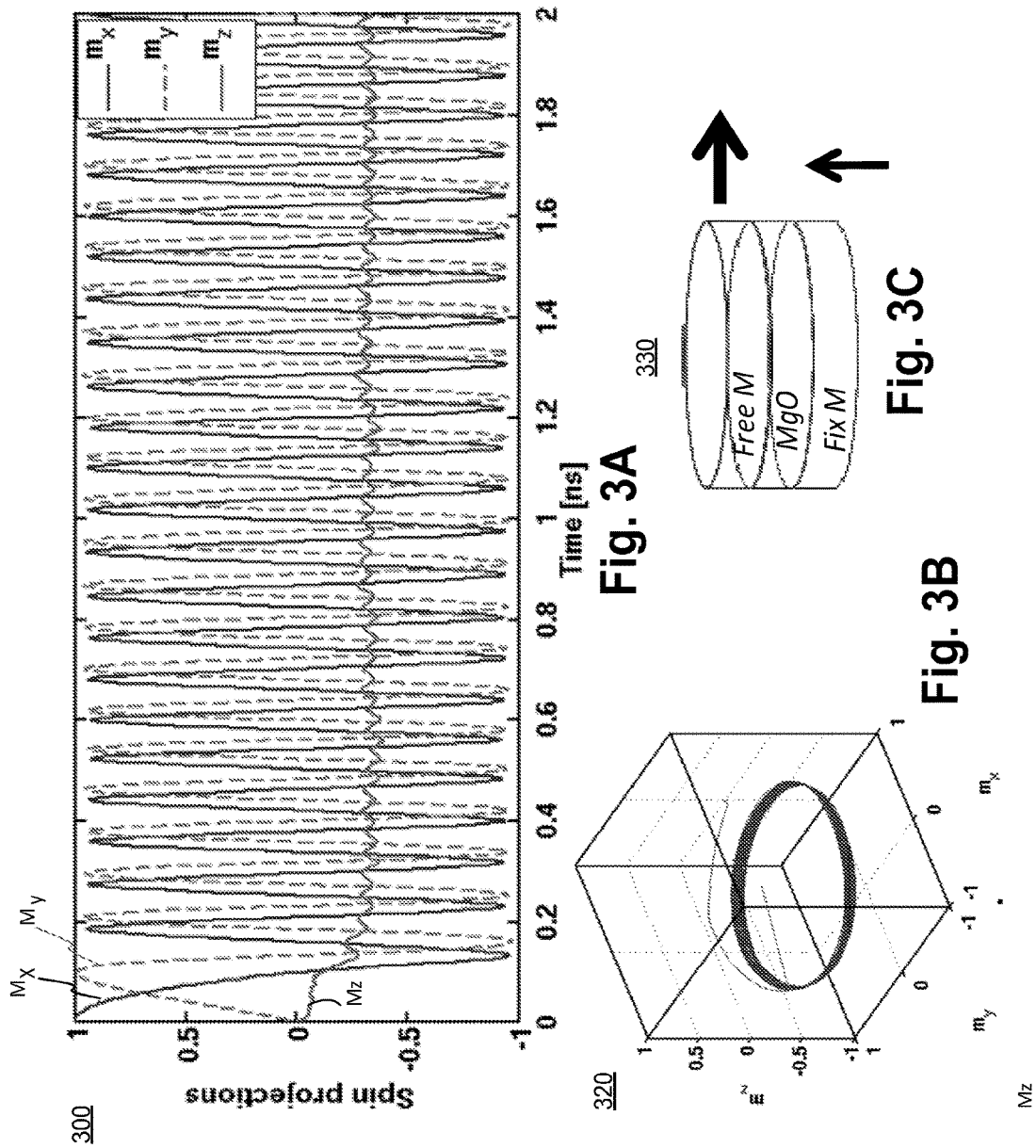
FIG. 3A illustrates a plot showing spin projections in the x, y, and z planes as a function of time for the SHO, according to one embodiment.
FIG. 3B illustrates a three dimensional plot showing oscillation of the SHO in a plane parallel to the x-y plane with deviation from steady state.
FIG. 3C illustrates a section of a MTJ with magnetizations to cause oscillation, according to one embodiment of the disclosure.

FIG. 3A illustrates a plot 300 showing spin projections in the x, y, and z planes as a function of time for the SHO, according to one embodiment. It is pointed out that those elements of FIG. 3A having the same reference numbers (or names) as the elements of any other figure can operate or function in any manner similar to that described, but are not limited to such.

In the Plot 300 horizontal axis is time in nanoseconds (ns) and the vertical axis shows the simulation waveforms of Spin Projection of MTJ 330 of FIG. 3C on the x, y, and z axes normalized to the total magnetization. FIG. 3C illustrates a section 330 of an MTJ device where the magnetization direction of the free magnetic layer is in-plane (shown pointing right) while the magnetization direction of the fixed magnetic layer is perpendicular (shown pointing up).

Referring back to FIG. 2B, an approximately square pulse shape of current $I_{OSC}$ conducted in SHE Interconnect 202 generates a spin current along the z-axis (perpendicular to the plane) and polarized is along the $m_x$-axis. The spin torque of this current is responsible for the oscillations of the spin projections in plot 300 (i.e., solid line) and $m_y$-axis (i.e., dotted line), where 'm' indicates spin projections in arbitrary units. Here, spin projections in the z-axis (i.e., $m_z$) do not oscillate (i.e., the solid line which is substantially horizontal). Plot 300 illustrates that the SHO of the embodiments can generate high amplitude oscillations without external magnetic bias.

FIG. 3B illustrates a three dimensional plot 320 showing the spin evolution trajectory, i.e. a three-dimensional plot of the spin projections of the SHO on the three axes. It is pointed out that those elements of FIG. 3B having the same reference numbers (or names) as the elements of any other figure can operate or function in any manner similar to that described, but are not limited to such. In this example, physical spin projections in the x and y directions oscillate (which corresponds to the oscillations in FIG. 3A) while the physical spin projections in the z-axis remain substantially constant.

Figure 4:
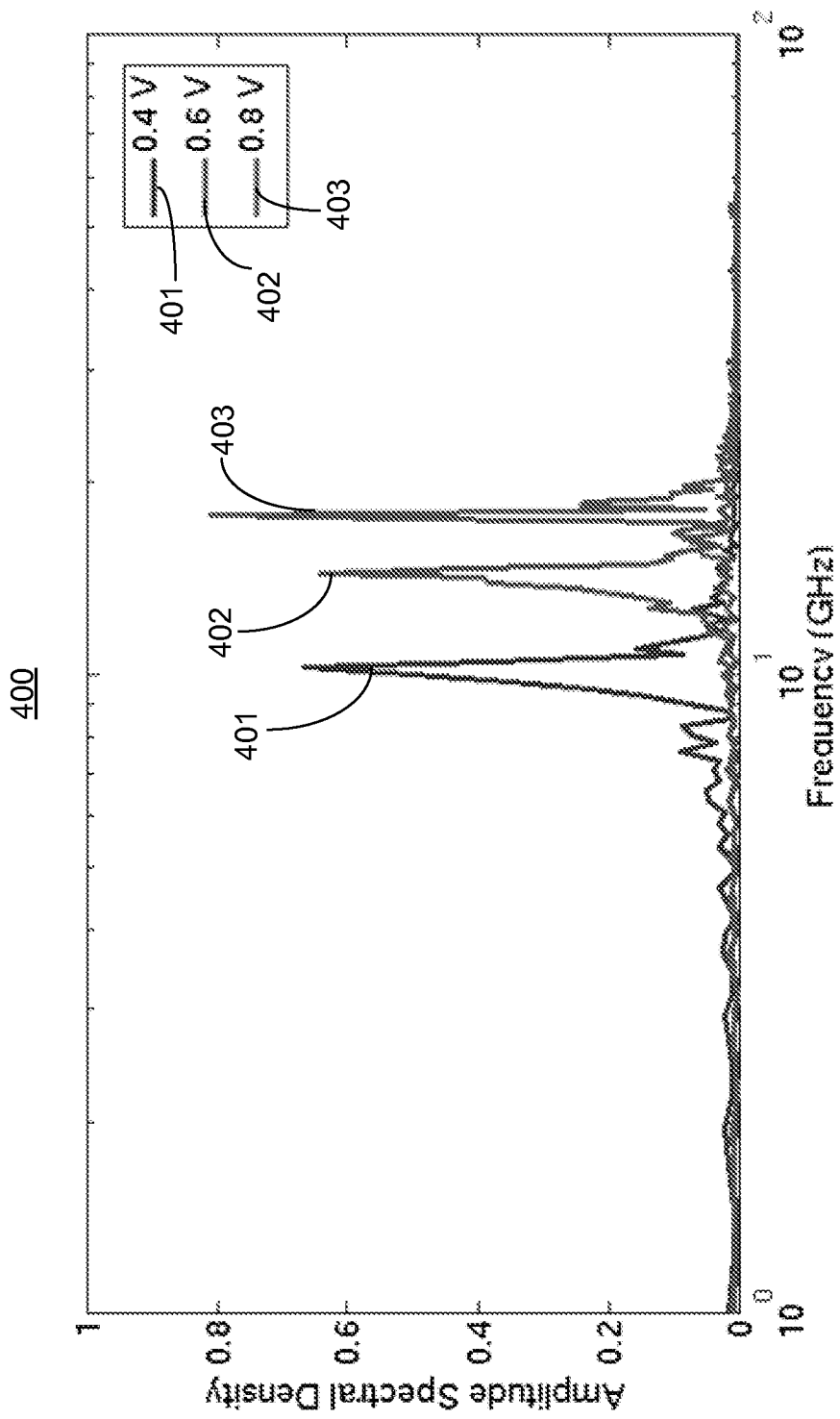
FIG. 4 illustrates a plot showing adjustment of oscillation frequency of the SHO as a function of applied voltage across the SHO, according to one embodiment.

FIG. 4 illustrates a plot 400 showing adjustment of oscillation frequency of the SHO as a function of applied voltage across the SHO, according to one embodiment. It is pointed out that those elements of FIG. 4 having the same reference numbers (or names) as the elements of any other figure can operate or function in any manner similar to that described, but are not limited to such.

Here, the horizontal axis is frequency in GHz and the vertical axis is Amplitude Spectral Density (v/sqrt(Hz)). Plot 400 illustrates how phase noise determines the spectral width of the output power (as indicated by the amplitude of spectral density). In one embodiment, the more thermally stable the magnet is, the smaller the phase noise in the oscillating signal. Thermal stability of the magnet increases with increasing volume or with increasing magnetic anisotropy of the nanomagnet. As described with reference to FIGS. 2A-B, when voltage $V_E$ across SHO 200/220 is applied, SHO 200/220 begins to generate an oscillating signal in SHE Interconnect 202. In one embodiment, the oscillating frequency of the oscillating signal can be adjusted by adjusting $V_E$. When $V_E$ is applied across SHO 200/220, $I_{Excite}$ is generated which causes the free-magnet to process and then generate oscillating signal $I_{OSC}$.

In this example, three voltage levels for $V_E$ are considered—401 which is 0.4V, 402 which is 0.6V, and 403 which is 0.8V. The oscillating frequencies for each of the three applied voltages (401, 402, and 403) are different which indicate a mechanism to fine tune oscillating frequency of the oscillating signal. In this example, the STO oscillating frequency tuning range is 20 GHz when $V_E$ is varied from 401 to 403.

Figure 5:
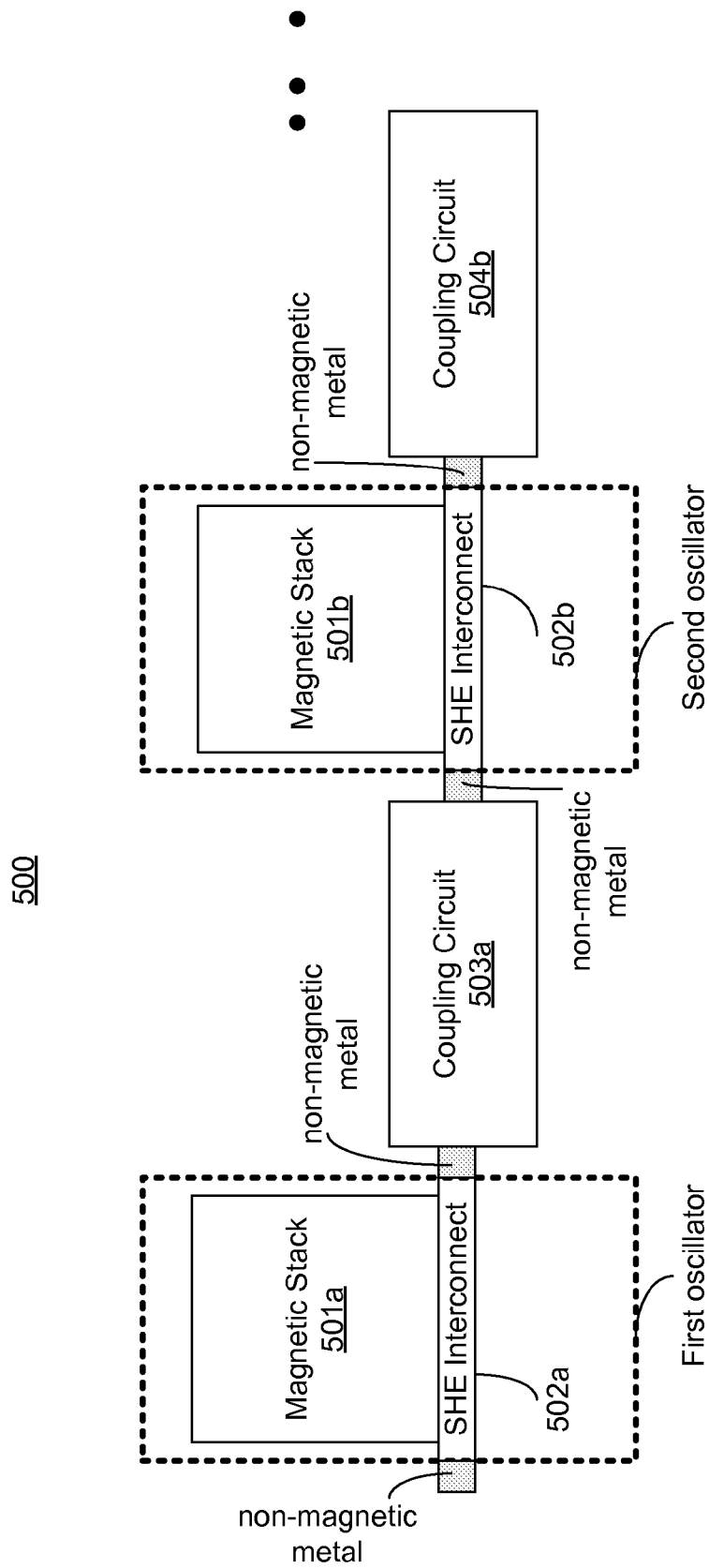
FIG. 5 illustrates a SHO having a plurality of coupled SHOs, according to one embodiment of the disclosure.

FIG. 5 illustrates an SHO 500 formed from a plurality of coupled SHOs, according to one embodiment of the disclosure. It is pointed out that those elements of FIG. 5 having the same reference numbers (or names) as the elements of any other figure can operate or function in any manner similar to that described, but are not limited to such. While the embodiments show two coupled SHOs, any number of SHOs can be coupled in one-dimension or two-dimension to generate multiple oscillating signals.

In one embodiment, SHO 500 comprises a First oscillator which includes a Magnetic Stack 501a (same as Magnetic Stack 201) and SHE Interconnect 502a (same as SHE Interconnect 202). In this embodiment, SHO 500 further includes a Second oscillator which includes its own Magnetic Stack 501b (same as Magnetic Stack 201) and SHE Interconnect 502b (same as SHE Interconnect 202). In one embodiment, the First and Second oscillators are coupled together by Coupling Circuit 503a.

In one embodiment, Coupling Circuit 503a couples the non-magnetic metal portions of the First and Second oscillators as shown. In one embodiment, an additional Coupling Circuit 503b is used to couple the Second oscillator with another Oscillator (not shown). In such an embodiment, a chain of oscillators can be coupled together by respective coupling circuits to form a coupled SHO. An exemplary operation of SHO 500 is described with reference to FIG. 8B.

Figure 7A:
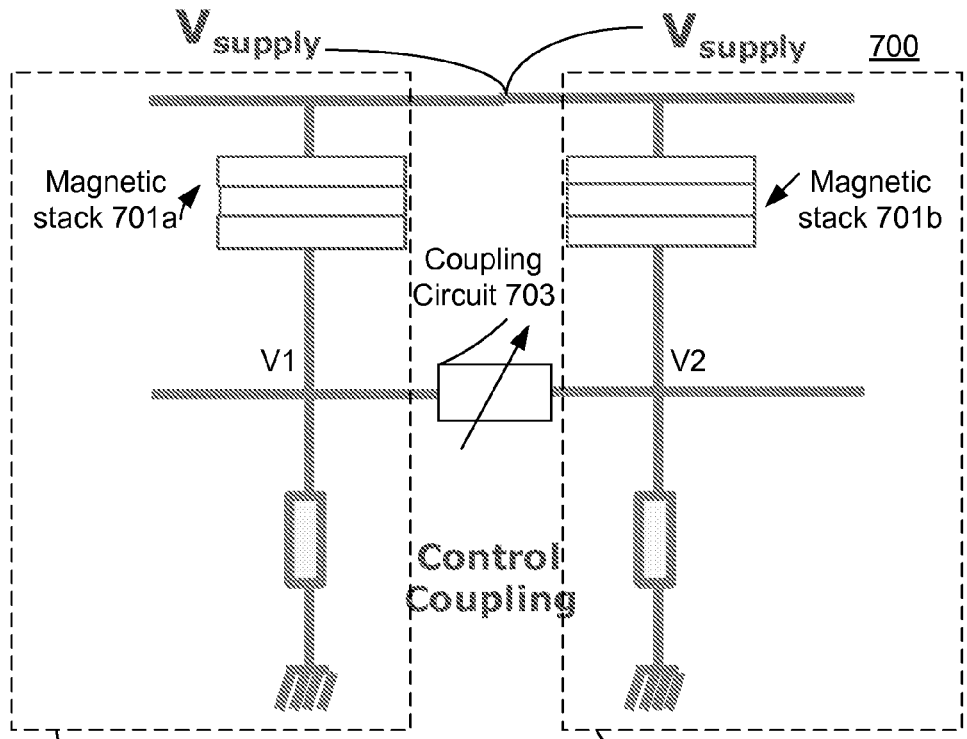
FIGS. 7A-B illustrate circuit models of two coupled SHOs, according to one embodiment of the disclosure.

Referring back to FIG. 5, in one embodiment, each oscillator (e.g., First or Second oscillators) is a three terminal self-sustained oscillator that operates by injection of charge current from the top electrode of the Magnetic Stack and a transverse bottom electrode (i.e., the SHE interconnect). In one embodiment, coupling provided by Coupling Circuits 503a and 503b is bidirectional coupling. The bi-directionality of coupling can be understood as follows. The coupling between the magnets occurs via injection of a spin current proportional to the charge current flowing between the oscillators. The charge current flowing in the coupling circuit is setup by the voltage difference between the nodes V1 and V2 as shown in FIG. 7A. V1 and V2 are in turn set by the actual magnetic condition of the oscillators 1 and 2. Hence, the coupling is bidirectional between the oscillators. Referring back to FIG. 5, in one embodiment, Coupling Circuit 503a (and/or 503b) comprises a transistor with a controllable gate terminal, such that the transistors source and drain terminals are coupled to the SHE interconnects of the First and Second oscillators.

For example, the source/drain terminal of the transistor is coupled to the non-magnetic metal which is also coupled to SHE Interconnect 502a, and the drain/source terminal of the transistor is coupled to the other non-magnetic metal which is also coupled to SHE Interconnect 502b. In one embodiment, SHO 500 further comprises a voltage source to control the voltage of the gate terminal to cause oscillation of the signal on SHE Interconnect 502a (also referred here as the first interconnect) to synchronize with oscillation of the signal on the SHE Interconnect 502b (also referred here as the second interconnect).

In one embodiment, Coupling Circuit 503a (and/or 503b) is a non-magnetic interconnect coupling the First and Second oscillators. In one embodiment, the non-magnetic interconnect is formed from one or more of: Cu, α-Ta, Al, CuSi, or NiSi. In one embodiment, Coupling Circuit 503a is formed of the same material as the non-magnetic metal portions coupled to SHE Interconnects 502a/b. In one embodiment, Coupling Circuit 503a is formed of different non-magnetic material than the non-magnetic metal portions coupled to SHE Interconnects 502a/b.

In one embodiment, Coupling Circuit 503a comprises a variable resistance device. In one embodiment, Coupling Circuit 503a is a signal processing unit which is operable to amplify, weaken, filter or phase shift a coupling signal strength, where the coupling signal traverses between the First and Second oscillators.

FIG. 6A illustrates an SHO 600 having a plurality of coupled SHOs with non-magnetic interconnect as the coupling circuit, according to one embodiment of the disclosure. It is pointed out that those elements of FIG. 6A having the same reference numbers (or names) as the elements of any other figure can operate or function in any manner similar to that described, but are not limited to such.

The embodiment of SHO 600 is similar to the embodiment of SHO 500 except for the following differences. Here, instead of more than two coupling circuits and oscillators, two oscillators (First and Second oscillators) are shown with a Coupling Circuit 603 which is coupled to SHE Interconnects 602a and 602b via non-magnetic metal Cu as shown. In this embodiment, each Magnetic Stack 501a and 501b is similar to the Magnetic Stack 220 of FIG. 2B. In this embodiment, magnetization direction of the free magnets (Free M) of the First and Second oscillators is in-plane (as indicated by the right pointing arrow) while the magnetization direction of the fixed magnets (Fix M) of the First and Second oscillators is perpendicular (as indicated by the top pointing arrow). Here, Coupling Circuit 602 is formed of Cu to couple the First and Second oscillators together.

In one embodiment, the Spin Hall current ($I_{OSC}$) from SHE Interconnect 602a interacts with the free magnetic layer (Free M) of the First oscillator to produce self sustained oscillation/excitation. In one embodiment, the second tunneling excitation current ($I_{Excite1}$) of the First oscullator interacts with a perpendicularly polarized fixed magnetic layer to produce/ensure self sustain oscillations. In one embodiment, the path through the MTJ of the First oscillator provides a sensing path generating an AC current at the oscillation frequency. In one embodiment, Coupling Circuit 602 through SHE Interconnect 602a of the First oscillator provides a path to couple the First oscillator to the Second Oscillator. While the embodiment of FIG. 6A is described with reference to two magnetic stacks, any number of magnetic stacks may be used and coupled together by coupling circuits. Likewise, in one embodiment, Coupling Circuit 603 can be any coupling circuit some of which are described with reference to FIG. 5.

FIG. 6B illustrates an SHO 620 having a plurality of coupled SHOs with non-magnetic interconnect as coupling circuit, according to another embodiment of the disclosure. It is pointed out that those elements of FIG. 6B having the same reference numbers (or names) as the elements of any other figure can operate or function in any manner similar to that described, but are not limited to such.

So as not to obscure the embodiments of FIG. 6B, differences between FIG. 6A and FIG. 6B are described. SHO 620 is similar to SHO 600 except that the magnetization directions of the respective MTJs of the First and Second oscillators is changed. Here, magnetization direction of the fixed magnets (Fix M) of the First and Second oscillators is in-plane (as indicated by the right pointing arrow) while the magnetization direction of the free magnets (Free M) of the First and Second oscillators is perpendicular (as indicated by the top pointing arrow). In one embodiment, the magnetization directions of the free magnets for all the SHOs are the same. In such an embodiment, the magnetization directions of the fix magnets for all the SHOs are the same too.

Figure 7B:
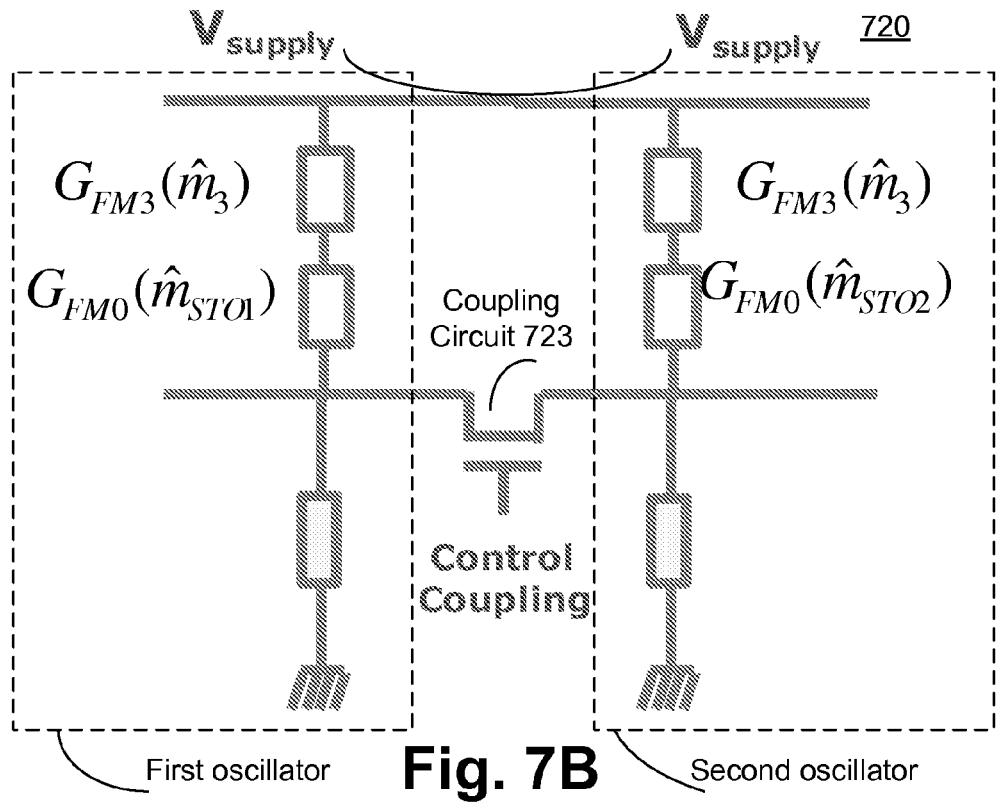

FIGS. 7A-B illustrate circuit models 700 and 720 of the plurality of coupled SHOs (e.g., First and Second oscillators of FIG. 6A), according to one embodiment of the disclosure. It is pointed out that those elements of FIGS. 7A-B having the same reference numbers (or names) as the elements of any other figure can operate or function in any manner similar to that described, but are not limited to such.

Circuit model 700 comprises models for two oscillators (i.e., First oscillator and Second oscillator). Here, each oscillator has a respective Magnetic Stack 701a and 701b which is coupled at one end to the power supply node $V_{supply}$ and to nodes V1 and V2 respectively at their respective other ends. In one embodiment, the First and Second oscillators are coupled together at nodes V1 and V2 by a Coupling Circuit 703 which is modeled as a variable resistor. By changing the resistance of the variable resistor, coupling coefficient can be adjusted to synchronize oscillation frequencies of the oscillation signals at nodes V1 and V2. In one embodiment, nodes V1 and V2 are further coupled to a third common terminal (e.g., ground) by conductance elements that are coupled in series with Magnetic stacks 701*a* and 701*b* respectively.

Circuit model 720 is similar to Circuit model 700 except that the Magnetic Stacks 701*a* and 702*b* are replaced by conductances. For example, Magnetic Stack 701*a* is replaced with a series combination of conductances ($G_{FM3}$ ($m_3$) and $G_{M0}(m_{STO1})$) between power supply node $V_{supply}$ and node V1. Likewise, Magnetic Stack 701*b* is replaced with a series combination of conductances ($G_{FM3}(m_3)$ and $G_{FM0}(m_{STO2})$) between power supply node $V_{supply}$ and node V2. The spin equivalent circuit of models 700 and 720 comprise tensor spin conduction matrix governed by the present condition of the magnets in the Magnetic stacks 701*a* and 701*b*. Here, Coupling Circuit 723 is modeled as a transistor having a gate terminal to adjust the resistance of the transistor.

The functionality of SHO 600 is simulated using a multi-physics simulation which treats the nano-magnets as single spin projections and uses spin circuit theory to calculate the scalar voltage and vector spin voltages, according to one embodiment. The fixed and free magnets of the First and Second oscillators are described by Landau-Lifshitz-Gilbert equations:

$$\frac{\partial m_1}{\partial t} = -\gamma \mu_0 [m_1 \times H_{\mathit{eff}}] + \alpha \left[ m_1 \times \frac{\partial m_1}{\partial t} \right] + \frac{I_{s1}}{eN_s}$$

$$\frac{\partial m_2}{\partial t} = -\gamma \mu_0 [m_2 \times H_{\mathit{eff}}] + \alpha \left[ m_2 \times \frac{\partial m_2}{\partial t} \right] + \frac{I_{s2}}{eN_s}$$

Here $I_{s1}$ and $I_{s2}$ are the projections perpendicular to magnetizations of the spin polarized currents entering the nano-magnets. These projection are derived from the spin-circuit analysis. The effective magnetic field $H_{\mathit{eff}}$ originating from shape and material anisotropy, and the Gilbert damping constant 'α' are the properties of the magnets. The spin currents are obtained from the transport models 700 and 720. In one embodiment, a self-consistent stochastic solver is used to account for thermal noise of the magnets.

Figure 8A:
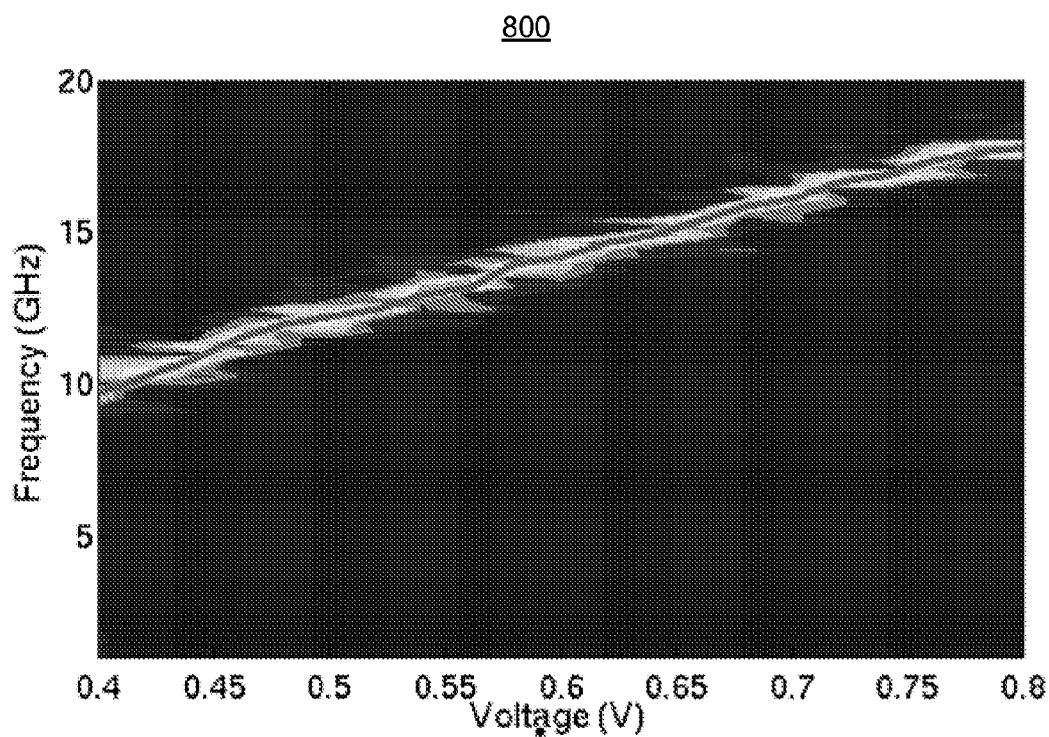
FIG. 8A illustrates a plot showing frequency simulation of a SHO with respect to applied voltage across the stacked memory, according to one embodiment of the disclosure.

FIG. 8A illustrates a plot 800 showing frequency simulation of SHO with respect to applied voltage across the stacked memory, according to one embodiment of the disclosure. It is pointed out that those elements of FIG. 8A having the same reference numbers (or names) as the elements of any other figure can operate or function in any manner similar to that described, but are not limited to such.

Here, x-axis is Voltage (V) and y-axis is Frequency (GHz). Plot 800 illustrates a spin current simulation of tunable bias free in-plane STO without external field bias. Circuit models 700/720 are used to simulate the SHO. Here, circuit simulation solves the magnetization dynamics of the magnetic layers of the device self consistently with the spin dependent transport through the circuit. Plot 800 shows that tunability over a wide operating range is achieved for in-plane SHOs for nominal processing conditions of the in-plane devices. Here, tunability range is observed over an octave from 10 GHz to 20 GHz with an applied bias $V_E$ tuning from 0.4V to 0.8V.

Figure 8B:
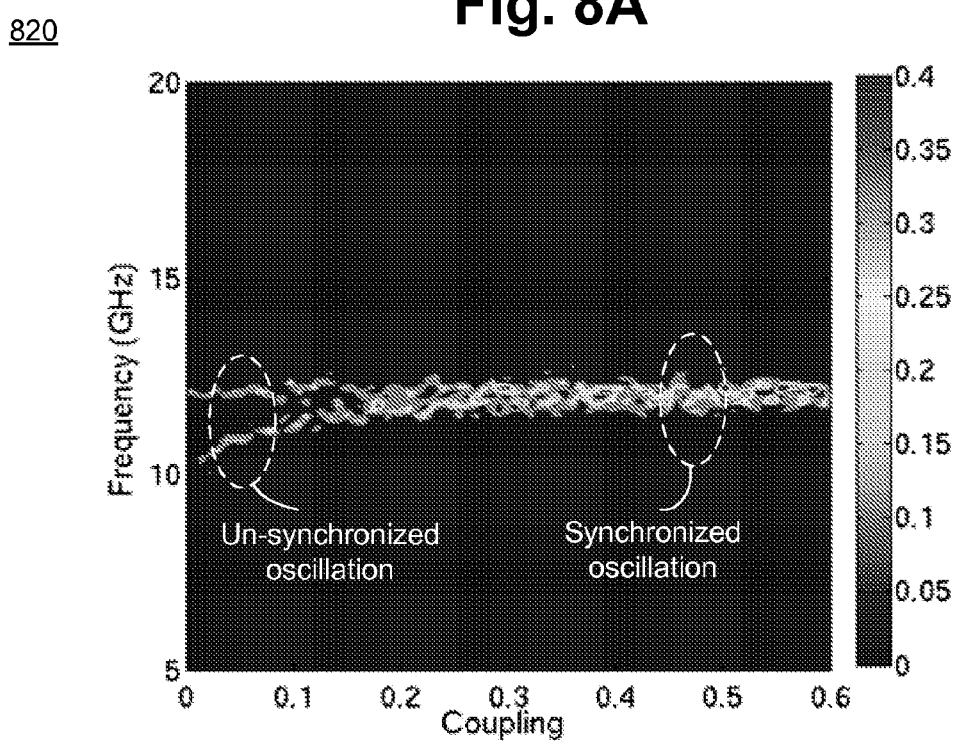
FIG. 8B illustrates a plot showing injection locking of a SHO with respect to coupling control provided by a coupling circuit, according to one embodiment of the disclosure.

FIG. 8B illustrates a plot 820 showing injection locking of SHO with respect to coupling control provided by a coupling circuit, according to one embodiment of the disclosure. It is pointed out that those elements of FIG. 8B having the same reference numbers (or names) as the elements of any other figure can operate or function in any manner similar to that described, but are not limited to such.

Here, x-axis is Coupling in 1/Ohms (i.e., conductivity of the coupling circuit) and y-axis is Frequency (GHz). In this case, resistance of Coupling Circuit 723 is adjusted by changing the voltage to the gate terminal of transistor. Here, two SHOs operating at 10 GHz and 12 GHz are tuned to the same frequency with a fixed phase difference to produce synchronized oscillators. When coupling voltage to the gate of the transistor is less than 0.1V, the two SHOs have unsynchronized oscillations. In this example, when coupling voltage is increased (e.g., near 0.5V), the two SHOs exhibit synchronized oscillations.

Figure 9:
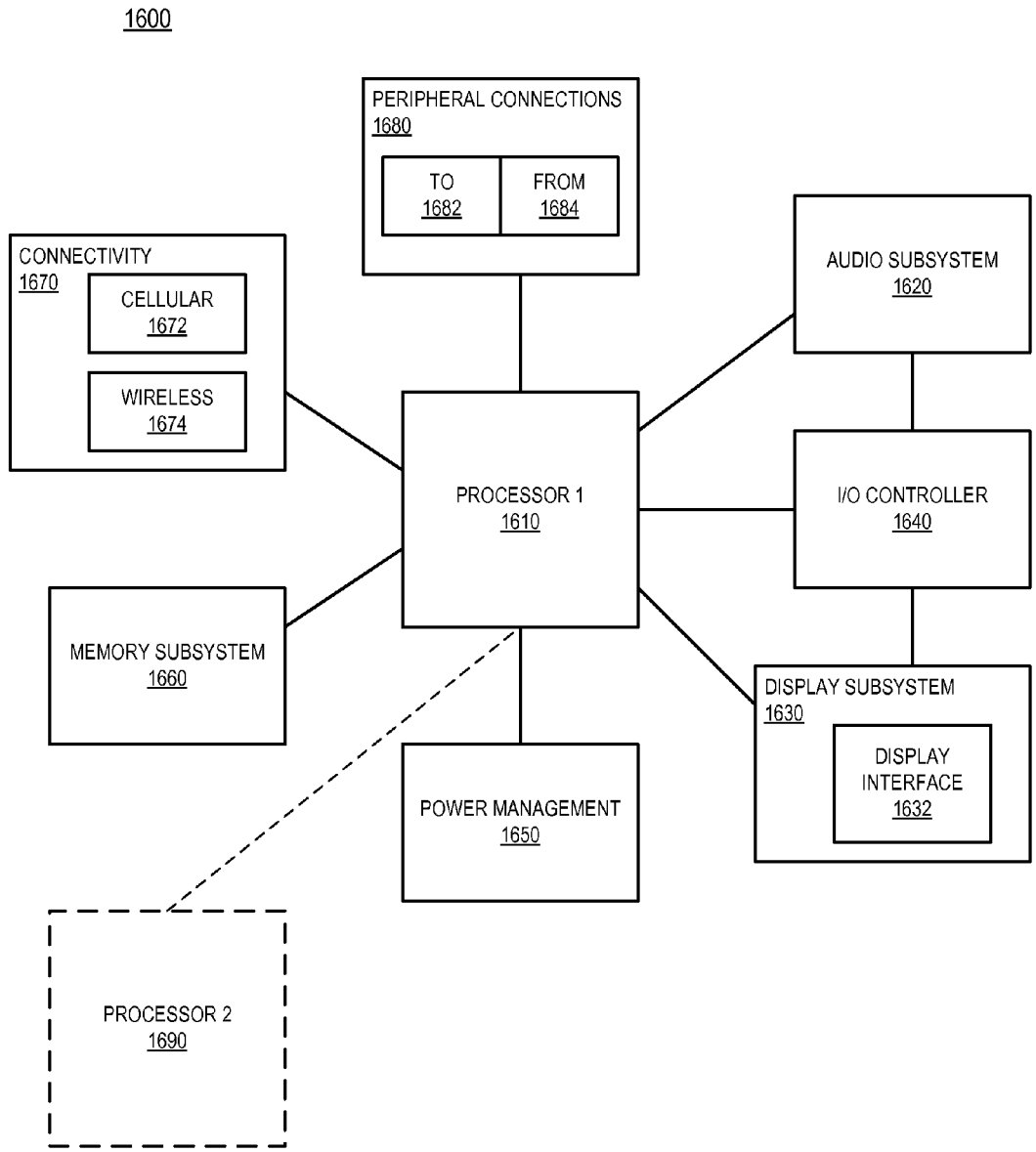
FIG. 9 is a smart device or a computer system or a SoC (system-on-chip) with an SHO, according to one embodiment of the disclosure.

FIG. 9 is a smart device or a computer system or a SoC (system-on-chip) with a SHO, according to one embodiment of the disclosure. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with the SHO, according to the embodiments discussed. Other blocks of the computing device 1600 may also include the SHO of the embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises an interconnect with spin-orbit coupling material; and a magnetic stack having two magnetic layers such that one of the magnetic layers is coupled to the interconnect, wherein each of the two magnetic layers have respective magnetization directions to cause the magnetic stack to oscillate. In one embodiment, the magnetic stack comprises a MTJ device. In one embodiment, the apparatus further comprises a voltage source to apply a voltage across the magnetic stack to cause a signal on the interconnect to oscillate. In one embodiment, the voltage source is operable to adjust the voltage across the magnetic stack to adjust oscillation frequency of the signal.

In one embodiment, the interconnect is coupled to a non-magnetic metal portion. In one embodiment, the non-magnetic metal portion is formed from one or more of: Cu, Co, α-Ta, Al, CuSi, or NiSi. In one embodiment, the spin-orbit coupling material is a SHE material. In one embodiment, the SHE material is formed from one or more of: W, Ta, Pt, CuIr, 4d or 5d metals with high spin orbit coupling. In one embodiment, the two magnetic layers include a free magnetic layer and a fixed magnetic layer, wherein the magnetization direction of the free magnetic layer is in-plane, and wherein the magnetization direction of the fixed magnetic layer is perpendicular to the magnetization direction of the free magnetic layer.

In one embodiment, the two magnetic layers include a free magnetic layer and a fixed magnetic layer, wherein the magnetization direction of the fixed magnetic layer is in-plane, and wherein the magnetization direction of the free magnetic layer is perpendicular to the magnetization direction of the fixed magnetic layer. In one embodiment, the two magnetic layers include a free magnetic layer and a fixed magnetic layer, and wherein the magnetization directions of the fixed and free magnetic layers are in-plane.

In another example, a system is provided which comprises: a memory; a processor coupled to the memory, the processor including an apparatus according to the apparatus discussed above; and a wireless interface for allowing the processor to communicatively couple with another device.

In another example, an apparatus is provided which comprises: a first oscillator including: a first interconnect with SHE material; and a first magnetic stack having two magnetic layers such that one of the magnetic layers is coupled to the first interconnect, wherein each of the two magnetic layers have respective magnetization directions to cause the first magnetic stack to oscillate a signal on the first interconnect. In one embodiment, the apparatus further comprises a second oscillator including: a second interconnect with SHE material; and a second magnetic stack having two magnetic layers such that one of the magnetic layers is coupled to the second interconnect, wherein each of the two magnetic layers have respective magnetization directions to cause the second magnetic stack to oscillate a signal on the second interconnect; and a coupling circuit to couple the first oscillator to the second oscillator.

In one embodiment, the coupling circuit comprises a transistor with a controllable gate terminal, and with source and drain terminals coupled to the first and second interconnects, respectively. In one embodiment, the apparatus further comprises a voltage source to control the voltage of the gate terminal to cause oscillation of the signal on the first interconnect to synchronize with oscillation of the signal on the second interconnect. In one embodiment, the coupling circuit is a non-magnetic interconnect coupling the first interconnect to the second interconnect.

In one embodiment, the coupling circuit comprises a variable resistance device. In one embodiment, the SHE material of the first and second interconnects is coupled to a non-magnetic metal layer. In one embodiment, the SHE materials of the first and second interconnects of each of the First and Second oscillators are formed from one or more of: W, Ta, Pt, CuIr, 4d or 5d metals with high spin orbit coupling. In one embodiment, the coupling circuit is a signal processing unit which is operable to amplify, weaken, filter or phase shift a coupling signal strength, the coupling signal traversing between the first and second oscillators.

In another example, a system is provided which comprises: a memory; a processor coupled to the memory, the processor including an apparatus according to the apparatus discussed above; and a wireless interface for allowing the processor to communicatively couple with another device.

In another example, an apparatus is provided which comprises: a first oscillator including a first interconnect with spin-orbit coupling material, and a first magnetic stack coupled to the first interconnect; a second oscillator including a second interconnect with spin-orbit coupling material, and a second magnetic stack coupled to the second interconnect; and a coupling circuit to couple the first oscillator to the second oscillator.

In one embodiment, the first magnetic stack has free and fixed magnetic layers such that the free magnetic layer is coupled to the first interconnect, and wherein the fixed magnetic layer has magnetization direction perpendicular to magnetization direction of the free magnetic layer. In one embodiment, the second magnetic stack has free and fixed magnetic layers such that the free magnetic layer is coupled to the second interconnect, and wherein the fixed magnetic layer has magnetization direction perpendicular to magnetization direction of the free magnetic layer.

In one embodiment, the first and second magnetic stacks have respective free and fixed magnetic layers such that the respective free magnetic layers are coupled to the first and second interconnects respectively, and wherein the respective fixed magnetic layers have magnetization directions parallel to magnetization directions of the respective free magnetic layers. In one embodiment, the first and second magnetic stacks have respective free and fixed magnetic layers such that the respective free magnetic layers are coupled to the first and second interconnects respectively, and wherein the respective fixed magnetic layers have magnetization directions perpendicular to magnetization directions of the respective free magnetic layers. In one embodiment, the coupling circuit is a signal processing unit which is operable to amplify, weaken, filter or phase shift a coupling signal strength, the coupling signal traversing between the first and second oscillators.

In another example, a system is provided which comprises: a memory; a processor coupled to the memory, the processor including an apparatus according to the apparatus discussed above; and a wireless interface for allowing the processor to communicatively couple with another device.

In another example, a method is provided which comprises: forming an interconnect with spin-orbit coupling material; and forming a magnetic stack having two magnetic layers such that one of the magnetic layers is coupled to the interconnect, wherein each of the two magnetic layers have respective magnetization directions to cause the magnetic stack to oscillate. In one embodiment, the magnetic stack comprises a Magnetic Tunnel Junction (MTJ) device.

In one embodiment, the method further comprises applying a voltage across the magnetic stack to cause a signal on the interconnect to oscillate. In one embodiment, the method further comprises adjusting the voltage across the magnetic stack to adjust oscillation frequency of the signal. In one embodiment, the method further comprises coupling the interconnect to a non-magnetic metal portion. In one embodiment, the method further comprises forming the non-magnetic metal portion from one or more of: Cu, α-Ta, Al, CuSi, or NiSi.

In one embodiment, the spin-orbit coupling material is a Spin Hall Effect (SHE) material. In one embodiment, the method further comprises forming the SHE material from one or more of: W, Ta, Pt, CuIr, 4d or 5d metals with high spin orbit coupling. In one embodiment, the two magnetic layers include a free magnetic layer and a fixed magnetic layer, wherein the method further comprises: forming magnetization direction of the free magnetic layer to be in-plane, and forming the magnetization direction of the fixed magnetic layer to be perpendicular to the magnetization direction of the free magnetic layer.

In one embodiment, the two magnetic layers include a free magnetic layer and a fixed magnetic layer, wherein the method further comprises: forming magnetization direction of the fixed magnetic layer to be in-plane; and forming magnetization direction of the free magnetic layer to be perpendicular to the magnetization direction of the fixed magnetic layer. In one embodiment, the two magnetic layers include a free magnetic layer and a fixed magnetic layer, and wherein the method further comprises: forming magnetization directions of the fixed and free magnetic layers to be in-plane.

In another example, an apparatus is provided which comprises: means for forming an interconnect with spin-orbit coupling material; and means for forming a magnetic stack having two magnetic layers such that one of the magnetic layers is coupled to the interconnect, wherein each of the two magnetic layers have respective magnetization directions to cause the magnetic stack to oscillate. In one embodiment, the magnetic stack comprises a Magnetic Tunnel Junction (MTJ) device.

In one embodiment, the apparatus further comprises means for applying a voltage across the magnetic stack to cause a signal on the interconnect to oscillate. In one embodiment, the apparatus further comprises means for adjusting the voltage across the magnetic stack to adjust oscillation frequency of the signal. In one embodiment, the apparatus further comprises means for coupling the interconnect to a non-magnetic metal portion. In one embodiment, the apparatus further comprises means for forming the non-magnetic metal portion from one or more of: Cu, α-Ta, Al, CuSi, or NiSi.

In one embodiment, the spin-orbit coupling material is a Spin Hall Effect (SHE) material. In one embodiment, the apparatus further comprises means for forming the SHE material from one or more of: W, Ta, Pt, CuIr, 4d or 5d metals with high spin orbit coupling. In one embodiment, the two magnetic layers include a free magnetic layer and a fixed magnetic layer, wherein the apparatus further comprises: means for forming magnetization direction of the free magnetic layer to be in-plane, and means for forming the magnetization direction of the fixed magnetic layer to be perpendicular to the magnetization direction of the free magnetic layer.

In one embodiment, the two magnetic layers include a free magnetic layer and a fixed magnetic layer, wherein the apparatus further comprises: means for forming magnetization direction of the fixed magnetic layer to be in-plane; and means for forming magnetization direction of the free magnetic layer to be perpendicular to the magnetization direction of the fixed magnetic layer. In one embodiment, the two magnetic layers include a free magnetic layer and a fixed magnetic layer, and wherein the apparatus further comprises: means for forming magnetization directions of the fixed and free magnetic layers to be in-plane.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first oscillator including: a first interconnect with Spin Hall Effect (SHE) material; and
   a first magnetic stack having two magnetic layers such that one of the magnetic layers is coupled to the first interconnect, wherein each of the two magnetic layers have respective magnetization directions to cause the first magnetic stack to oscillate a signal on the first interconnect;
   a second oscillator including:
   a second interconnect with SHE material; and a second magnetic stack having two magnetic layers such that one of the magnetic layers is coupled to the second interconnect, wherein each of the two magnetic layers have respective magnetization directions to cause the second magnetic stack to oscillate a signal on the second interconnect; and a coupling circuit to couple the first oscillator to the second oscillator, wherein the coupling circuit comprises a transistor with a controllable gate terminal, and with source and drain terminals coupled to the first and second interconnects respectively.

2. The apparatus of claim 1 further comprises a voltage source to control the voltage of the gate terminal to cause oscillation of the signal on the first interconnect to synchronize with oscillation of the signal on the second interconnect.

3. The apparatus of claim 1, wherein the coupling circuit is a non-magnetic interconnect coupling the first interconnect to the second interconnect.

4. The apparatus of claim 1, wherein the coupling circuit comprises variable resistance device.

5. The apparatus of claim 1, wherein the SHE material of the first and second interconnects is coupled to a non-magnetic metal layer.

6. The apparatus of claim 1, wherein the SHE materials of the first and second interconnects of each of the first and second oscillators are formed from one or more of: W, Ta, Pt, CuIr, 4d or 5d metals with high spin orbit coupling.

7. The apparatus of claim 1, wherein the coupling circuit is a signal processing unit which is operable to amplify, weaken, filter or phase shift a coupling signal strength, the coupling signal traversing between the first and second oscillators.

8. An apparatus comprising:
a first oscillator including a first interconnect with spin-orbit coupling material, and a first magnetic stack coupled to the first interconnect;
a second oscillator including a second interconnect with spin-orbit coupling material, and a second magnetic stack coupled to the second interconnect; and
a coupling circuit to couple the first oscillator to the second oscillator, wherein the coupling circuit comprises a transistor with a controllable gate terminal, and with source and drain terminals coupled to the first and second interconnects respectively.

9. The apparatus of claim 8, wherein the first magnetic stack having free and fixed magnetic layers such that the free magnetic layer is coupled to the first interconnect, and wherein the fixed magnetic layer having magnetization direction perpendicular to magnetization direction of the free magnetic layer.

10. The apparatus of claim 8, wherein the second magnetic stack having free and fixed magnetic layers such that the free magnetic layer is coupled to the second interconnect, and wherein the fixed magnetic layer having magnetization direction perpendicular to magnetization direction of the free magnetic layer.

11. The apparatus of claim 8, wherein the first and second magnetic stacks having respective free and fixed magnetic layers such that the respective free magnetic layers are coupled to the first and second interconnects respectively, and wherein the respective fixed magnetic layers having magnetization directions parallel to magnetization directions of the respective free magnetic layers.

12. The apparatus of claim 8, wherein the first and second magnetic stacks having respective free and fixed magnetic layers such that the respective free magnetic layers are coupled to the first and second interconnects respectively, and wherein the respective fixed magnetic layers having magnetization directions perpendicular to magnetization directions of the respective free magnetic layers.

13. The apparatus of claim 8, wherein the coupling circuit is a signal processing unit which is operable to amplify, weaken, filter or phase shift a coupling signal strength, the coupling signal traversing between the first and second oscillators.

* * * * *